(12) United States Patent
Chu et al.

(10) Patent No.: US 6,767,831 B1
(45) Date of Patent: Jul. 27, 2004

(54) METHOD FOR FORMING COBALT SALICIDES

(75) Inventors: Hong-Yuan Chu, Taichung (TW); Chih-Jian Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/632,380

(22) Filed: Aug. 1, 2003

(51) Int. Cl.[7] .............................................. H01L 21/44
(52) U.S. Cl. .................... 438/682; 438/486; 438/527; 438/530; 438/597; 438/301
(58) Field of Search ................................ 438/584, 592, 438/597, 620, 530, 514, 527, 299, 301, 303, 682, 486

(56) References Cited

U.S. PATENT DOCUMENTS

| | | | | |
|---|---|---|---|---|
| 5,759,899 A | * | 6/1998 | Saito | 438/303 |
| 5,998,272 A | * | 12/1999 | Ishida et al. | 438/305 |
| 6,008,111 A | * | 12/1999 | Fushida et al. | 438/584 |
| 6,121,137 A | * | 9/2000 | Saito | 438/682 |
| 6,225,176 B1 | * | 5/2001 | Yu | 438/305 |
| 6,361,847 B1 | * | 3/2002 | Magnusson et al. | 428/68 |
| 6,362,063 B1 | * | 3/2002 | Maszara et al. | 438/307 |
| 6,368,947 B1 | * | 4/2002 | Yu | 438/530 |
| 6,403,981 B1 | * | 6/2002 | Yu | 257/63 |
| 6,451,679 B1 | * | 9/2002 | Hu et al. | 438/592 |
| 6,461,945 B1 | * | 10/2002 | Yu | 438/510 |
| 6,596,599 B1 | * | 7/2003 | Guo | 438/305 |
| 2003/0211684 A1 | * | 11/2003 | Guo | 438/230 |

* cited by examiner

*Primary Examiner*—Matthew Smith
*Assistant Examiner*—Victor Yevsikov
(74) *Attorney, Agent, or Firm*—Tung & Associates

(57) ABSTRACT

A method for forming salicides with reduced junction leakage including providing a semiconductor process wafer comprising a silicon substrate; inducing amorphization within the silicon substrate to a form a first amorphous region having a first predetermined depth measured from the silicon substrate surface; carrying out at least one first thermal annealing process to controllably partially recrystallize the first amorphous region to produce a second amorphous region having a second predetermined depth less than the first predetermined depth; depositing a metal layer over selected areas of the silicon substrate comprising the second amorphous region; and, carrying out at least one second thermal annealing process to form a metal silicide.

25 Claims, 2 Drawing Sheets

METHOD FOR FORMING COBALT SALICIDES

FIELD OF THE INVENTION

This invention generally relates to semiconductor processing methods for forming salicides (self-aligned suicides) over silicon areas and more particularly to a method for forming cobalt salicides for deep-submicron (<0.25 micron) and nanometer (<0.1 micron) MOSFET semiconductor devices to reduce parasitic current leakage including junction leakage.

BACKGROUND OF THE INVENTION

In the integrated circuit industry today, hundreds of thousands of semiconductor devices are built on a single chip. Contact resistances between functioning areas of a MOSFET device such as a source or drain regions and polysilicon electrodes are critical to the functioning of a MOSFET device, for example a CMOS transistor. For example, metal interconnect features are formed to connect source/drain and gate electrode regions to other parts of a functioning semiconductor device. Source and drain regions of a transistor are doped portions of a semiconductor substrate, for example single crystal silicon or epitaxially grown silicon. The source and drain regions are typically formed by implanting ions in the silicon substrate to achieve n-doped regions or p-doped regions. To prevent the contamination of the silicon substrate by contacting metal interconnects and to reduce a sheet resistance of the polysilicon gate electrode, an intermediate layer of a metal silicide is formed over the source/drain and gate electrode contact regions, for example, titanium silicide or cobalt silicide. Metal silicides are thermally stable at higher temperatures and prevent metals from diffusing into the silicon substrate as well as reduce a sheet resistance between the contact regions, for example the source/drain regions and the channel edge.

To satisfy the requirements for low-resistance for the gate and source/drain contact regions cobalt silicide (e.g., $CoSi_2$) and titanium silicide ($TiSi_2$) have been the most commonly used suicides to form salicides. The severity of the effect of increased resistance on the drain side of the transistor depends on whether the transistor is operating in the saturated region or the linear region, the reduction of drain voltage having less effect if operation is in the saturated region. Increased contact resistance on the source side of the transistor is more severe, reducing the effective gate voltage, and severely degrading device performance. It has been found that self aligned silicides (salicides) covering the entire source/drain area is the one of the most effective solutions to decreasing contact and sheet resistance and improving device performance allowing device scaling below 0.25 microns. A low sheet and contact resistance at the source and drain regions as well as the polysilicon gate is critical to high speed digital CMOS technology and RF applications.

One problem in forming salicides is that the sheet resistance of $TiSi_2$ increases with decreasing design rules or gate length of the polysilicon gate. $TiSi_2$ tends to agglomerate with increased sheet resistance when formed overlying narrow contact regions and subjected to high annealing temperatures, for example, using a rapid thermal anneal (RTA). Consequently, $CoSi_2$ is a preferred material for forming salicides for sub-quarter micron and particularly, sub 0.1 micron (nanometer) devices since the sheet resistance of $CoSi_2$ is independent of the size of the contact region. For example, the required phase transformation to form the low electrical resistance crystalline phase takes place at lower temperatures from about 600° C. to about 700° C. without the coincident problem of silicide agglomeration.

In a typical salicide process, a metal, for example titanium or cobalt is deposited to cover the gate, source and drain regions. The metal is then subjected to a two step high temperature anneal where a metal silicide is formed by binary diffusion of silicon and metal atoms thereby forming metal silicides. Carrying out the annealing process in nitrogen causes formation of metal nitrides within the metal, slowing the silicon diffusion to prevent what is referred to as bridging, where silicon diffuses into the sidewall regions of the deposited metal along the gate or sidewall spacers causing a short electrical circuit between the gate electrode and the source/drain region. The likelihood of bridging increases as the annealing temperature is increased, providing another factor favoring the use of cobalt silicide.

$CoSi_2$ salicides however, have been found to have serious drawbacks and limitations as well, especially as design rules decrease to 0.1 micron and below. For example $CoSi_2$ salicides have been found to have sporadically high parasitic current leakage paths including junction and diode leakage. One factor contributing to increased junction leakage in the use of $CoSi_2$ is the roughness of the interface at the $CoSi_2$/silicon interface caused by $CoSi_2$ "spiking" where Co diffuses unevenly into the silicon substrate. Various approaches proposed to improve this problem including various low and high temperature annealing treatments have met with limited success.

There is therefore a need in the semiconductor processing art to develop a method for forming improved $CoSi_2$ salicides having reduced parasitic electrical leakage paths while maintaining a low sheet resistance.

It is therefore an object of the invention to provide a method for forming improved $CoSi_2$ salicides having reduced parasitic electrical leakage paths while maintaining a low sheet resistance thereby improving electrical behavior while overcoming other shortcomings of the prior art.

SUMMARY OF THE INVENTION

To achieve the foregoing and other objects, and in accordance with the purposes of the present invention, as embodied and broadly described herein, the present invention provides a method for forming salicides with reduced junction leakage.

In a first embodiment, the method includes providing a semiconductor process wafer comprising a silicon substrate; inducing amorphization within the silicon substrate to a form a first amorphous region having a first predetermined depth measured from the silicon substrate surface; carrying out at least one first thermal annealing process to controllably partially recrystallize the first amorphous region to produce a second amorphous region having a second predetermined depth less than the first predetermined depth; depositing a metal layer over selected areas of the silicon substrate comprising the second amorphous region; and, carrying out at least one second thermal annealing process to form a metal silicide.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps for forming salicides in a sub-quarter micron technology CMOS transistor. It will be appreciated that the method may be used with larger device technologies, but that it is most advantageously used with sub-quarter micron design rule technologies (e.g., <0.25 microns), including less than about 0.1 micron (nanometer) design rule technology. It will further be appreciated that although the method of the present invention is most advantageously used and an exemplary implementation detailed with respect to the formation of cobalt silicide to form cobalt salicides, that the method may be advantageously used for the formation of other metal salicides, including titanium silicide ($TiSi_2$).

Figure 1A:
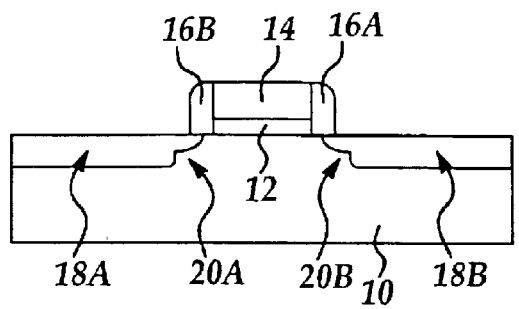
FIGS. 1A–1E are cross sectional schematic representations of a portion of a CMOS transistor showing stages in manufacture for forming salicided areas according to an embodiment of the present invention.

In an exemplary embodiment of the present invention, reference is made to FIGS. 1A–1E where cross sectional schematic views are shown of an exemplary MOSFET CMOS transistor in stages of manufacture according to embodiments of the present invention. For example, referring to FIG. 1A, is shown a portion of a CMOS transistor structure having a polysilicon gate electrode 14 formed over a gate dielectric 12, and having sidewall spacers 16A and 16B formed according to known processes in the art. The gate dielectric may be silicon oxide (e.g., $SiO_2$) formed by growing by a thin film of thermal oxide over the silicon substrate growing process using wet or dry methods to a thickness of about 15 Angstroms to about 50 Angstroms. A high-K gate dielectric may used in place of the gate oxide dielectric by first growing a thin film of interfacial oxide followed by forming a high-K dielectric layer stack, for example, using binary metal oxides having a dielectric constant of greater than about 20. A polysilicon gate electrode e.g. 14 is then formed over the gate dielectric 12 by conventional deposition, patterning, and etching processes. The sidewall spacers 16A and 16B are typically formed of at least one of silicon nitride (e.g., $Si_2N_3$) and silicon oxide (e.g., $SiO_2$) optionally including multiple layers to adjust the spacer width. For example, doped regions in the silicon substrate 10, include a doped source region, e.g., 18A and a doped drain region, e.g., 18B as well as lightly doped regions (LDD) 20A and 20B, also referred to as source/drain extensions (SDE) which are formed by conventional masking and ion implantation techniques following patterning of polysilicon gate electrode 12 and prior to formation of the sidewall spacers 16A and 16B. Subsequently, the sidewall spacers 16A and 16B are formed by conventional photolithographic patterning and etching processes and formed adjacent the sidewalls of the polysilicon gate electrode 12.

Following formation of the sidewall spacers, one or more additional ion implants are carried out using the sidewall spacers 16A and 16B as implantation masks to form more heavily doped regions, e.g., 18A, 18B adjacent to the SDE regions, e.g., 20A, 20A.

Figure 1B:
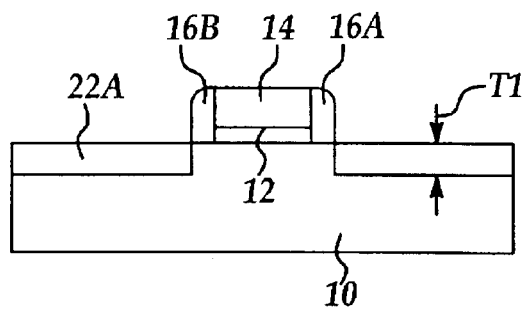

Referring to FIG. 1B, is shown the CMOS transistor without the doped regions for clarity since the doped regions e.g., 18A, 18B may be formed to be partially within or totally within the first formed amorphous region. According to an embodiment of the present invention, a first amorphous region e.g., 22A is induced in the silicon substrate 10 adjacent the gate sidewalls 16A and 16B, either simultaneously with, or following the source/drain ion implantation, preferably having a continuously amorphous thickness e.g., T1 measured from the silicon wafer process surface from about 10 nm to about 500 nm depending on the energies of the ion implant and the dopant used in the ion implant. For example boron and arsenic are typically used dopants in the ion implantation process at doses of about 1 to $5\times10^{15}$ dopant atoms/$cm^2$. In order to prevent self annealing, for example during boron implantations, the substrate temperature may be optionally cooled below about 23° C., for example, maintained between about 0° C. to about 23° C. It will be appreciated that a wide variety of implantation dopant ions and energies are used in different device formation processes.

It will also be appreciated that amorphization of the silicon wafer begins at the depth of maximum nuclear collision energy deposition with an amorphous interface moving toward the process surface as the degree of amorphization increases.

According to an embodiment of the present invention, an ion implantation process, including the S/D ion implantation process is preferably carried out at sufficient energies and for a sufficient period of time to induce silicon amorphization extending from a depth, e.g., T1 of about 10 nm to about 500 nm within the silicon wafer to the silicon wafer process surface. It will also be appreciated that the orientation of the single crystal silicon wafer as well as the angle of incidence of the implanted ions will affect the degree of induced amorphization. For example, any crystalline orientation of the silicon wafer may be used but is preferably in one of a (100) or (111) orientation. Alternatively selective epitaxial growth of silicon over the silicon wafer source/drain regions to form raised source/drains may be carried out prior to forming the first amorphous region. Further, it will be appreciated that the depth of the first amorphous region 22A will vary depending on the energy and mass of the ions implanted and the presence of any overlying layers of oxide or nitride. For example, to produce shallow junction depth implants, implants for boron, phosphorus, and arsenic will have energies ranging from about 0.2 keV to about 100 keV.

For example, to produce a continuously amorphous region 22A extending to the process surface within the depth T1, the ion implantation process may optionally include an ion implantation process carried out prior to and/or following the S/D ion implant process, for example including one or more additional ion implantation, for example, using Si and Ge ions to controllably and selectively achieve a continuously amorphous region to a predetermined depth, e.g., T1 within the silicon wafer. In another embodiment, the ion implantation process may optionally include implanting impurity ions such as oxygen, carbon, and nitrogen prior to and/or following the amorphization inducing ion implantation, preferably having a shallower penetration depth into the silicon wafer, for example between about 10 nm to about 60 nm measure for the process surface, to slow the recrystallization rate of the first amorphous region in a subsequent annealing process thereby allowing a greater degree of control and controllably partially recrystallize the first amorphous region recrystallization to produce a second amorphous region having a smaller depth. It will be appreciated that several ion implantation methods may be suitably used including the use of high energy beam lines as well as plasma assisted doping.

Figure 1C:
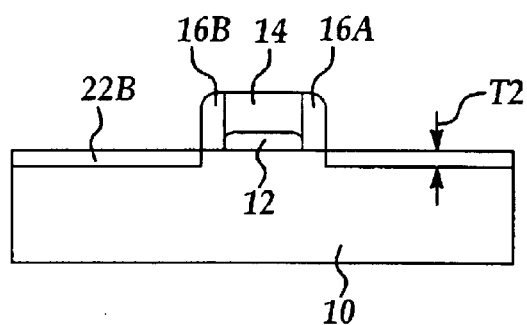

Referring to FIG. 1C, according to an aspect of the present invention, following creation of the first amorphous silicon region 22A, an annealing process including at least one annealing step, preferably including a rapid thermal anneal (RTA) process is carried out to controllably and selectively partially recrystallize the first amorphous region 22A to leave a second amorphous silicon region 22B. The second amorphous region, 22B preferably extends from the silicon wafer process surface to a predetermined depth T2 having a smaller depth than the first amorphous region, for example from about 5 nm to about 60 nm. Preferably, the crystalline/amorphous interface of the second amorphous silicon region is controllably formed to present a smooth interface, for example having peaks and valleys along the interface varying by less than about plus or minus 20 Angstroms along the interface. For example, recrystallization of the first amorphous silicon region 22A begins at the maximum depth of amorphization where the crystalline/amorphous interface moves towards the silicon wafer process surface as recrystallization proceeds. It will be appreciated that the rate of recrystallization or the rate of movement of the crystalline/amorphous interface will vary depending on the annealing temperature, silicon crystalline orientation, the implantation dose used to create the first amorphous region, and implantation ion type including impurity ions present.

Preferably a rapid temperature anneal (RTA) process is used for the partial recrystallization process to controllably anneal single wafers using a range of temperature ramp speeds, for example from about 25° C. to about 75° C. For example, the RTA recrystallization process preferably includes annealing in the temperature range of about 500° C. to about 650° C., where epitaxial recrystallization of the amorphous silicon region takes place, allowing the rate and degree of recrystallization as well as the smoothness of the crystalline/amorphous interface to be controllably reproduced.

Figure 1D:
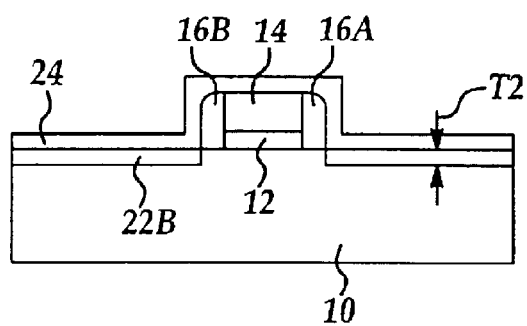

Referring to FIG. 1D, following the selectively partial recrystallization process, one of a $TiSi_2$ and $CoSi_2$ layer 26, most preferably $CoSi_2$, is formed over the second amorphous region 22B. For example in an exemplary embodiment, a metal layer 24, preferably cobalt, is blanket deposited by a conventional PVD method to a thickness of about 10 nanometers to about 100 nanometers. For example, following deposition of the cobalt metal layer 24, the process wafer is subjected to a rapid thermal anneal (RTA) where the wafer is heated in a multi-step process first to about 425° C. to about 475° C. to form CoSi and then to about 700° C. to about 750° C. to form $CoSi_2$, preferably in a nitrogen atmosphere.

Figure 1E:
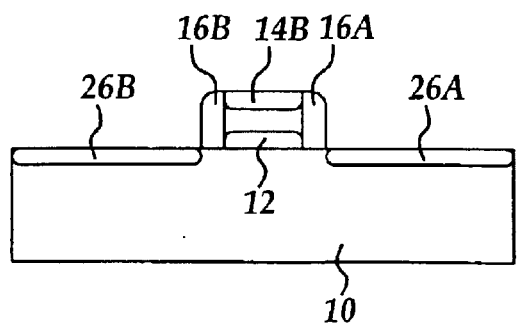

Referring to FIG. 1E, during the RTA process cobalt silicide ($CoSi_2$) is formed over silicon or polysilicon areas, e.g., the upper portion of polysilicon gate electrode 14B, and over the source and drain regions e.g., 26AA and 26B by counter diffusion of silicon and cobalt to form cobalt silicide ($CoSi_x$, e.g., $CoSi_2$). In the case titanium salicide is formed, the metal layer is a titanium layer followed by a multi-step RTA process where a first RTA process is carried out at a temperature of about 620° C. to about 680° C. followed by a second RTA process at temperatures higher than about 750° C. to form a low resistance phase of titanium silicide (e.g., $TiSi_2$) over exposed silicon containing portions of the substrate.

For example, it has been found according to embodiments of the present invention, that the recrystallization process of the first silicon amorphous region may be advantageously controlled to produce a second silicon amorphous region having a predetermined depth from the silicon wafer surface including a reproducibly smooth and well-defined silicon crystalline/amorphous interface. According to preferred embodiments, the silicon crystalline/amorphous interface within the silicon wafer is controllably positioned to predetermined depths to provide a well-defined and smooth interface which acts as a diffusion barrier in the subsequent $CoSi_2$ formation process. For example, according to prior art processes diffusion of Co at lower temperatures along crystalline grain boundaries is believed to occur leading is to undesirable (CoSi) "spiking" thereby causing a roughened $CoSi_2$/Si interface which contributes to parasitic current leakages. The method of the present invention creates a selectively controlled amorphous region with a predetermined depth including an amorphous/crystalline interface which acts as a Co diffusion barrier to inhibit Co diffusion at lower temperatures thus preventing or reducing CoSi "spiking" in the cobalt silicide formation process. As a result, parasitic current leakages including junction leakage as well as S/D leakage (diode leakage) is reduced according to preferred embodiments of the present invention thereby improving device performance and reliability.

Referring to FIG. 1E, following the silicidation process, conventional processes are carried out to complete the formation of the salicide, including a wet acidic etching process to selectively etch away the unsilicided portions of the cobalt layer, for example over the sidewall spacer 16A and 16B sidewalls to form a self-aligned silicide (salicide) including over source and drain regions e.g., 18A and 18B and the upper portion of the gate electrode e.g., 14B.

Figure 2:
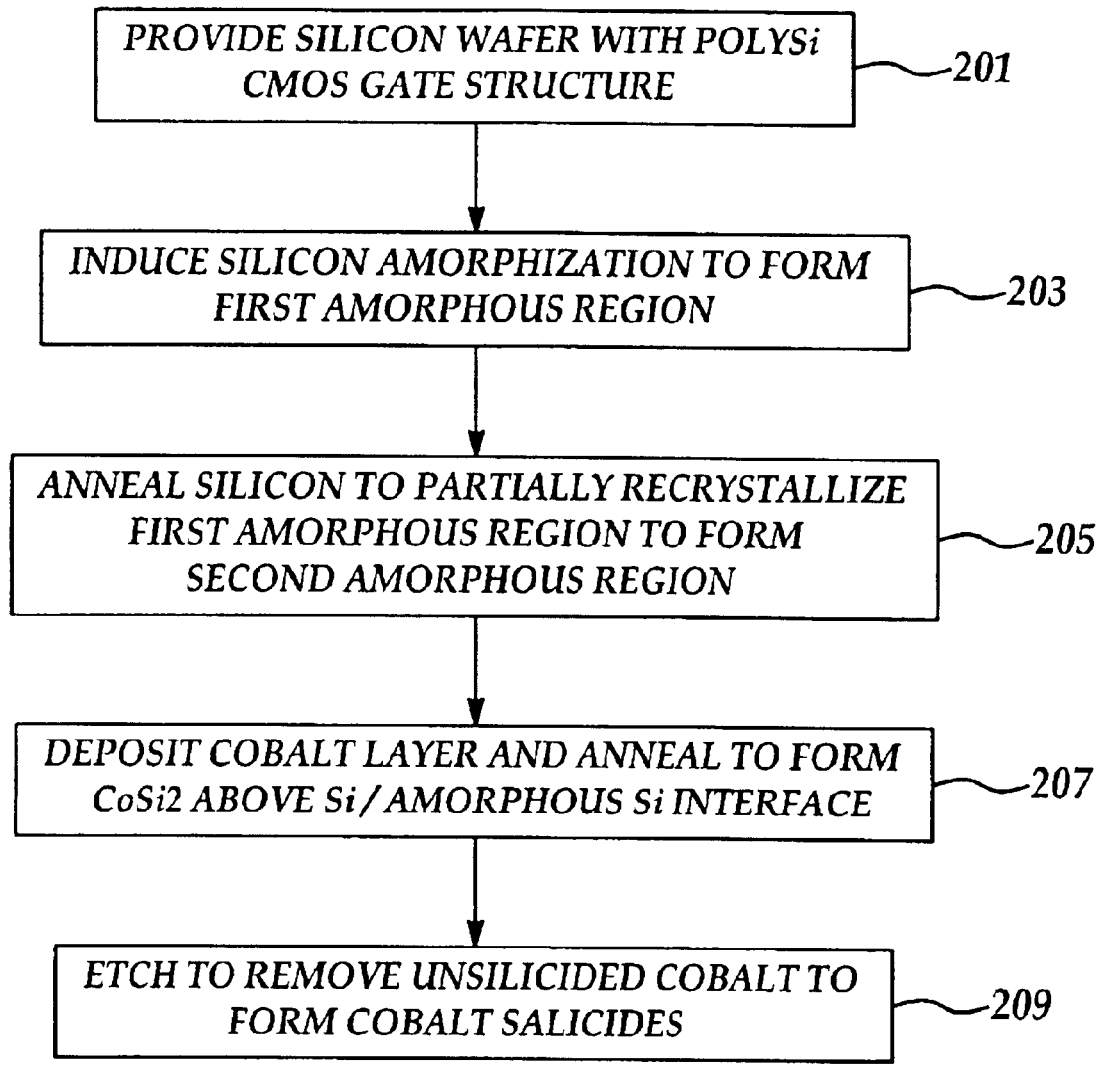
FIG. 2 is a process flow diagram including several embodiments of the present invention.

Referring to FIG. 2 is a process flow diagram including several embodiments of the present invention. In process 201, a silicon process wafer including a polysilicon gate structure is provided. In process 203, a silicon amorphization inducing process is carried out to form a first amorphous region in the silicon process wafer. In process 205, an annealing process is carried out to partially recrystallize the silicon wafer to leave a second amorphous region having a predetermined depth from the silicon process wafer surface. In process 207, metal, preferably cobalt is deposited and a metal silicide is formed over selected portions second amorphous region to form salicides, e.g. , $CoSi_2$. In process 209, the salicide formation process is completed by selectively removing unsilicided metal portions.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming salicides with reduced junction leakage comprising the steps of:

providing a semiconductor process wafer comprising a silicon substrate;

controllably inducing amorphization within the silicon substrate to a form a first amorphous region having a first predetermined depth measured from the silicon substrate surface;

carrying out at least one first thermal annealing process to controllably partially recrystallize the first amorphous region to produce a second amorphous region having a second predetermined depth less than the first predetermined depth;

depositing a metal layer over selected areas of the silicon substrate comprising the second amorphous region; and, carrying out at least one second thermal annealing process to form a metal silicide.

2. The method of claim 1, wherein the metal silicide is formed substantially above an interface comprising the second amorphous region and crystalline silicon.

3. The method of claim 1, wherein the silicon substrate comprises single crystalline silicon in one of (111) and (100) orientation.

4. The method of claim 1, wherein the step of inducing amorphization comprises at least one ion implantation process.

5. The method of claim 4, wherein the at least one ion implantation process comprises ions selected from the group consisting of B, P, As, Si, Ge, O, C, and N.

6. The method of claim 4, wherein the at least one ion implantation process comprises a source/drain implant.

7. The method of claim 4, wherein the at least one ion implantation process comprises implanting O, C, and N in an upper surface of the first amorphous region to control the recrystallization rate in the at least one first thermal annealing process.

8. The method of claim 1, wherein the first amorphous region is formed at a depth of from about 10 nm to about 500 nm.

9. The method of claim 1, wherein the second amorphous region is formed at a depth of from about 5 nm to about 60 nm.

10. The method of claim 1, wherein the metal is at least one of cobalt and titanium.

11. The method of claim 1, wherein the metal silicide is a self-aligned metal silicide.

12. The method of claim 1, further comprising wet etching unsilicided areas of the metal layer with a wet etching solution leave salicides covering exposed silicon and polysilicon areas.

13. The method of claim 12, wherein the exposed silicon and polysilicon areas comprise at least one of a gate electrode, a source region, and drain region.

14. The method of claim 13, wherein the exposed silicon and polysilicon areas comprise a CMOS transistor having a design rule of less than about 0.25 microns.

15. A method for forming cobalt salicides with reduced CoSi spiking in sub quarter-micron and nanometer microelectronic circuits comprising the steps of:

provingding a semiconductor process wafer comprising a MOSFET gate structure formed over a silicon substrate;

inducing amorphization within the silicon substrate to a form a first amorphous region having a first predetermined depth measured from the silicon substrate surface;

carrying out at least one first thermal annealing process to controllably partially recrystallize the first amorphous region to produce a second amorphous region having a second predetermined depth less than the first predetermined depth;

depositing a layer of cobalt metal over the semiconductor process wafer including the second amorphous region; and, carrying out at least one second thermal annealing process to form a cobalt silicide ($CoSi_2$) wherein an interface comprising the second amorphous region and crystalline silicon inhibits Co diffusion to reduce Co spiking.

16. The method of claim 15, wherein the metal silicide is formed substantially above the interface.

17. The method of claim 15, wherein the at least one first thermal annealing process comprises a temperature from about 500° C. to about 650° C.

18. The method of claim 15, wherein the step of inducing amorphization comprises at least one ion implantation process.

19. The method of claim 18, wherein the at least one ion implantation process comprises ions selected from the group consisting of B, P, As, Si, Ge, O, C, and N.

20. The method of claim 18, wherein the at least one ion implantation process comprises a source/drain implant.

21. The method of claim 15, wherein the second amorphous region is formed at a depth of from about 5 nm to about 60 nm.

22. The method of claim 15, further comprising wet etching unsilicided areas of the cobalt layer with a wet etching solution to leave cobalt salicided areas covering exposed silicon and polysilicon areas.

23. The method of claim 22, wherein the exposed silicon and polysilicon areas comprise at least one of a gate electrode, a source region, and drain region.

24. The method of claim 15, wherein the MOSFET device comprises a design rule of less than about 0.25 microns.

25. The method of claim 15, wherein the MOSFET device comprises a design rule of less than about 0.10 microns.

* * * * *